(12) United States Patent
Liu et al.

(10) Patent No.: US 6,215,838 B1
(45) Date of Patent: Apr. 10, 2001

(54) APPARATUS AND METHOD FOR CUMULATIVELY ELIMINATING NOISE

(75) Inventors: Yen-Yi Liu; Chiung-Ching Ku; Jyn-Guo Hwang; Strung-An Tarng, all of Hsin-Chu (TW)

(73) Assignee: Elan Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/433,222

(22) Filed: Nov. 4, 1999

(51) Int. Cl.[7] .................................................. G06M 3/00
(52) U.S. Cl. ................................ 377/28; 377/45; 327/379
(58) Field of Search .......................... 377/28, 45; 327/379

(56) References Cited

U.S. PATENT DOCUMENTS 4,667,338 * 5/1987 Toyonaga et al. ..................... 377/45

* cited by examiner

Primary Examiner—Margaret R. Wambach
(74) Attorney, Agent, or Firm—Bacon & Thomas, PLLC

(57) ABSTRACT

An apparatus for eliminating noise is disclosed. The present invention includes a counter, which counts in a first direction when an input signal is active, and in a second direction otherwise. A determining device is used to determine a predetermined first threshold value, and assert an output signal while such value is reached. The present invention also includes a limiting device, which prevents the counter from counting beyond or below a predetermined limit value.

21 Claims, 10 Drawing Sheets

APPARATUS AND METHOD FOR CUMULATIVELY ELIMINATING NOISE

BACKGROUND OF THE INVENTION

1. Field of the Invention

The present invention relates to an apparatus and method for eliminating noise, and more particularly to an apparatus and method for cumulatively eliminating the superimposition of extra-signal fluctuations that corrupt an information signal. Still more particularly, the present invention relates to an apparatus and method for recovering an information signal corrupted by noise.

2. Description of the Prior Art

Noise commonly exists in a communication system to adversely affect the communication of a clean information signal. While the information signal is corrupted to some extent by the superimposition of the noise during the transmission, the voltage potential of the received information signal becomes unpredictable.

For instance, most of the modern telephone companies provide a call-waiting service through which a third party can be selectively connected to a called party. This is usually accomplished by firstly sending a composite signal (for example, a combined 2130 Hz and 2750 Hz signal) from a central exchange office to the called party. Subsequently, a detecting circuit located near the called party is used to detect this composite signal, and then respond to the central exchange office. Moreover, the central exchange office may further provide pertinent information of the third party to the called party.

Unfortunately, during the active period (for example, about 80 ms) of the composite signal, the detecting circuit may miss the composite signal due to the fact that the composite signal is probably corrupted by the surrounding sound signal. Moreover, the detecting circuit may mis-detect a normal sound signal as the composite signal, thereby false triggering a composite signal.

An apparatus in the art as shown in FIG. 1 was disclosed to overcome the aforementioned problem. A counter 11 is used to detect an incoming signal IDET by continuously counting under a system clock CK. The counter 11 is reset by a reset circuit 12 whenever absence of the input signal IDET exists, for example, at time t1, t2 or t4 as shown in FIG. 2A. Further, the count of the counter 11 is fed to a determining circuit 13, which outputs an active signal DET1 whenever the count reaches a threshold value TH, for example, at time t3.

Unfortunately, the conventional apparatus of FIG. 1 can not be used to detect a severely corrupted signal such as that shown in FIG. 2B. As demonstrated in FIG. 2B, the count of the counter 11 is repeatedly reset whenever encountering the noise (which has low voltage potential in this example), thereby missing the input signal IDET. The disadvantage of the conventional apparatus of FIG. 1 can not be improved even by using a lower threshold value TH, which will undesirably result in false triggers.

For the foregoing reasons, there is a need for an apparatus and method for eliminating the superimposition of extra-signal fluctuations that corrupt an information signal, and overcoming the disadvantages of the prior apparatus or method that usually misses detecting the input signal or generates false triggering in detecting a severely corrupted signal.

SUMMARY OF THE INVENTION

In accordance with the present invention, an apparatus and method is provided for cumulatively eliminating the superimposition of extra-signal fluctuations that corrupt an information signal. The present invention eliminates the disadvantages of the prior apparatus or method that usually misses detecting the input signal or generates false triggering in detecting a severely corrupted signal.

In one embodiment, an up-down counter is used to count up when an incoming signal is active, and count down when the signal is not active. A determining circuit, which asserts an output signal when the counter reaches a predetermined up-threshold value, is also included. The output signal remains asserted until the counter reaches a predetermined down-threshold value, wherein the up-threshold value is generally greater than the down-threshold value. Finally, a limit controller is used to prevent the counter from counting beyond a predetermined first limit value, and from counting below a predetermined second limit value, wherein the second limit value is generally equal to or less than the down-threshold value. In the embodiment, a resetting circuit is further included to respond to the output signal, so that the counter is reset when the counter counts down reaching the down-threshold value; and a setting circuit is further included for setting the counter to the first limit value when the output signal is asserted.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
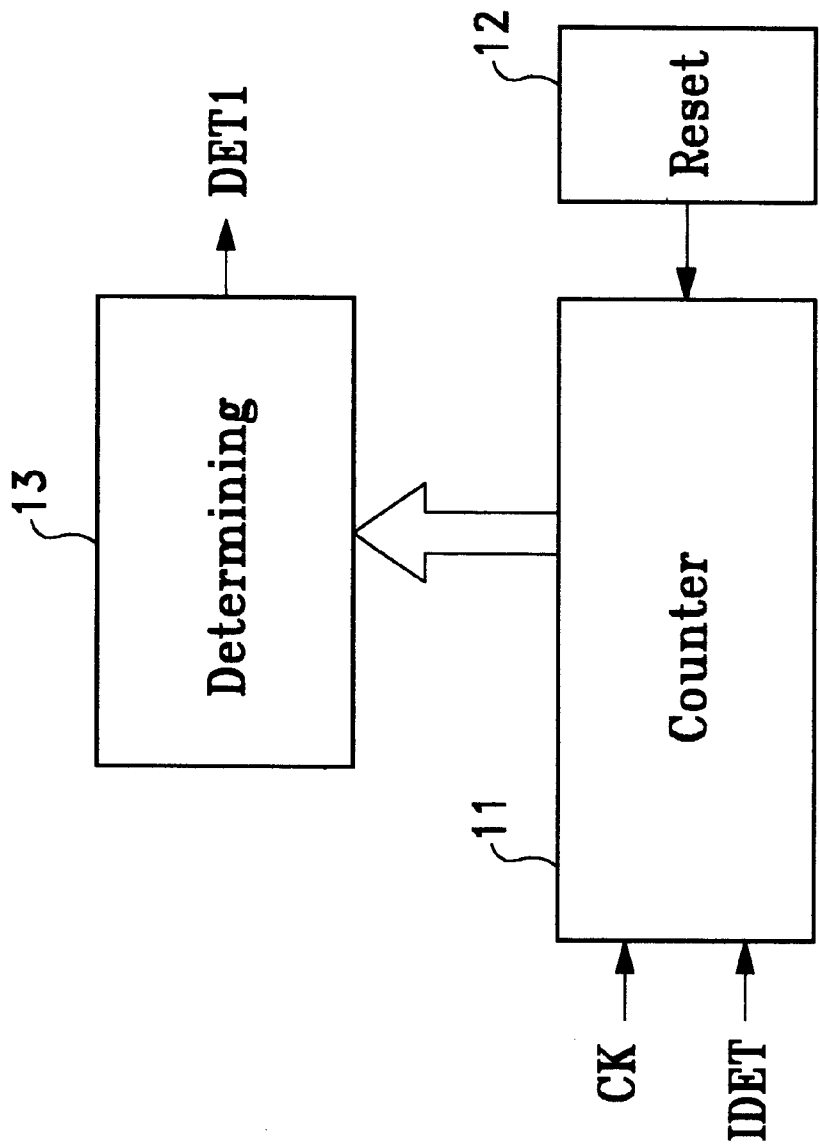
FIG. 1 shows a schematic diagram illustrating a traditional apparatus for detecting a signal corrupted by noise.
Figure 2A:
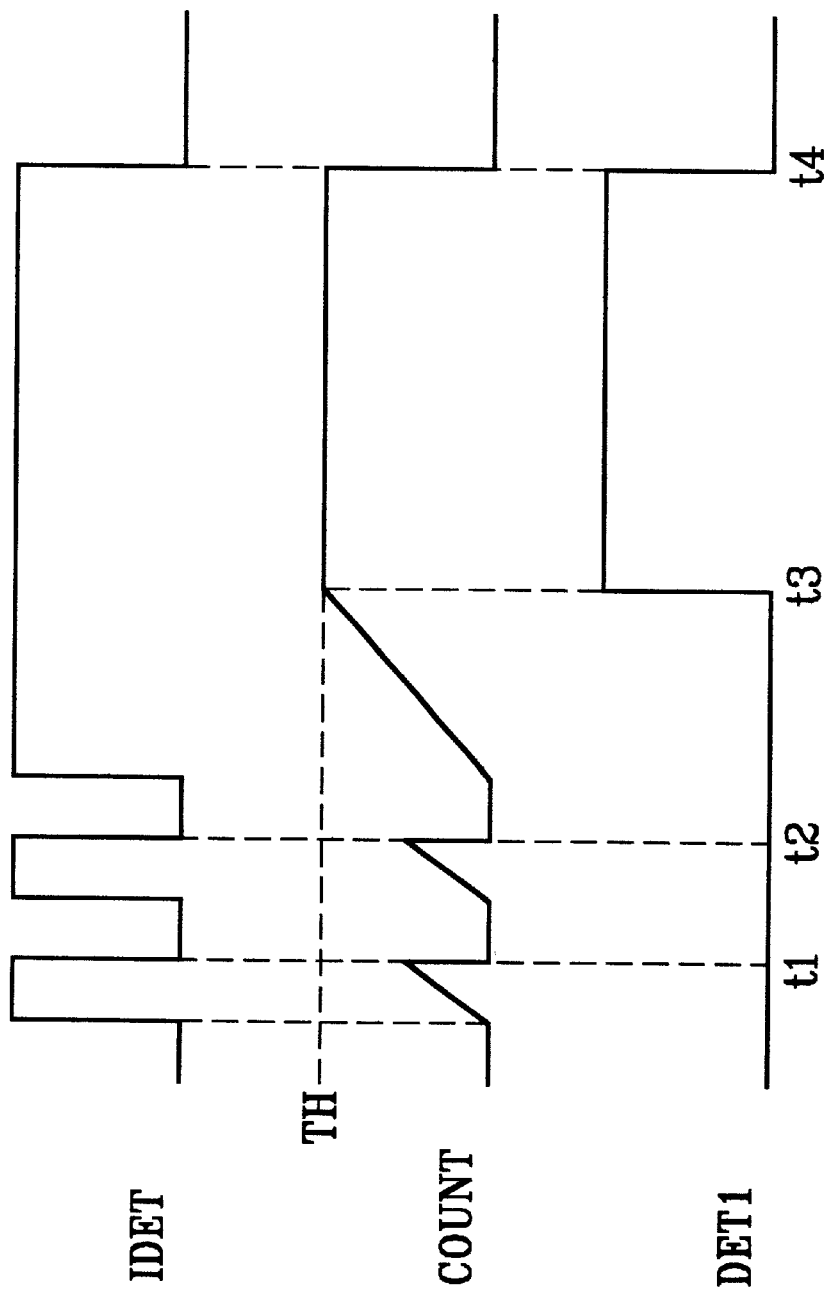
FIG. 2A shows a timing diagram pertinent to FIG. 1.
Figure 2B:
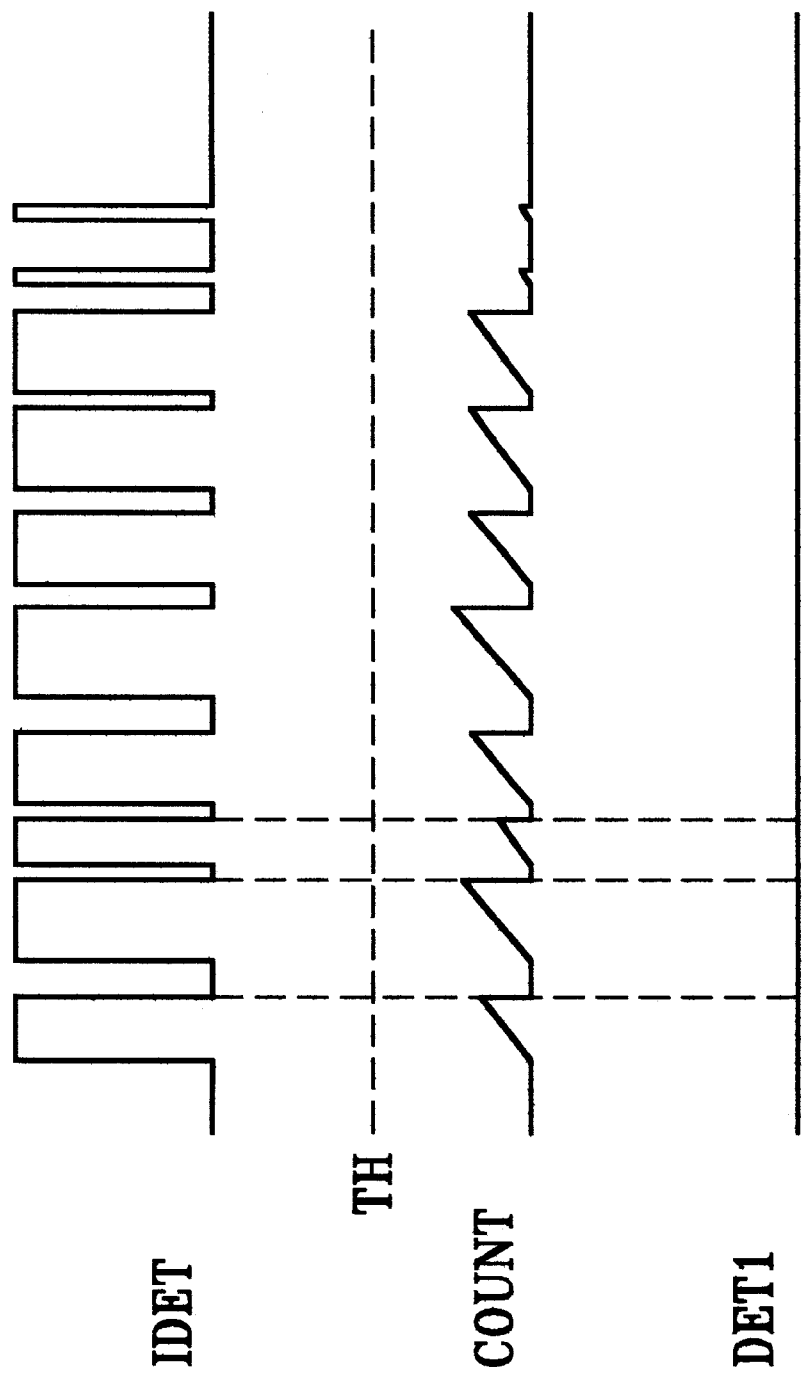
FIG. 2B shows another timing diagram pertinent to FIG. 1.
Figure 3:
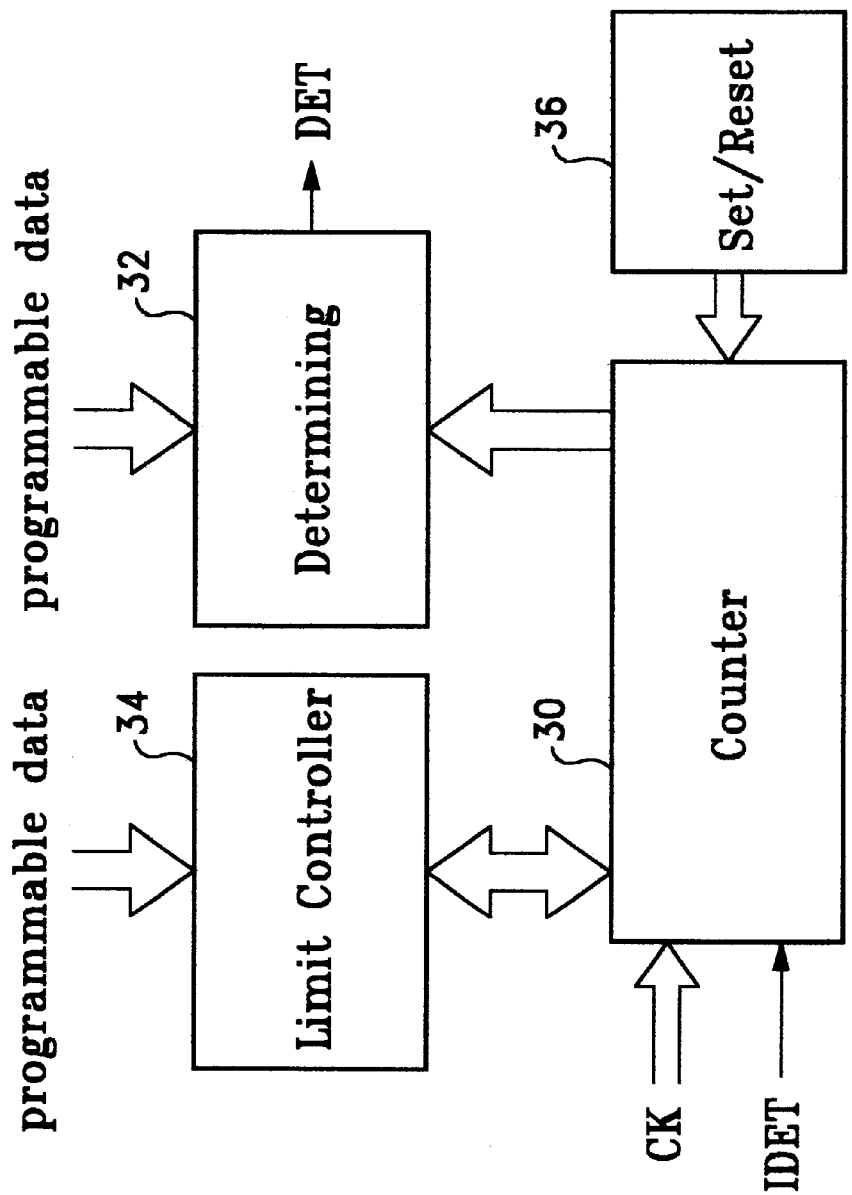
FIG. 3 shows a system block diagram of the apparatus according to one embodiment of the present invention.

FIG. 3 shows a system block diagram of an apparatus for cumulatively eliminating noise superimposed on an information signal according to one embodiment of the present invention. The accompanying flow of the operation of the apparatus is further shown in FIGS. 4A and 4B. A counter 30 (FIG. 3), which can controllably count up or down, is used to receive an incoming signal IDET. In this embodiment, a traditional up-down counter is used as the counter 30. It is appreciated that other conventional counters that perform the same function as described hereinafter can be equivalently utilized. The counter 30 counts upward or downward under a system clock CK. When the presence of an active signal IDET (for example, IDET=1) is detected by the counter 30 (step 42, FIG. 4A), the counter 30 continuously count up toward an up-threshold value in step 43. Subsequently, in step 45, a determining subsystem or circuit 32 determines whether the count of the counter 30 has reached the up-threshold value in response to the count from the counter 30. It is noted that the up-threshold value can be a fixed and predetermined value that is pre-stored in the determining subsystem 32, or can be a variable that is dynamically written into the determining subsystem 32 via programmable data input terminals as depicted in FIG. 3.

If the up-threshold value is reached, the YES branch of the block 45 leads to step 47, in which the output signal DET of the determining subsystem 32 (FIG. 3) is asserted active, indicating that the presence of the active signal IDET is detected. On the other hand, if the up-threshold value is not reached yet, the NO branch of the block 45 leads back to the step 42 for further detecting the incoming signal IDET.

Referring back to the block 42, when the presence of an active signal IDET is not detected, the NO branch of the block 42 leads to step 44, in which a limit controller 34 (FIG. 3) decides whether the count of the counter 30 reaches a down-limit value. It is noted that the down-limit value can be a fixed and predetermined value that is pre-stored in the limit controller 34, or can be a variable that is dynamically written into the limit controller 34 via programmable data input terminals as depicted in FIG. 3.

If the count reaches the down-limit value, then the flow of the apparatus returns to the step 42 and nothing needs to be done; otherwise, the counter 30 continuously counts down.

Figure 4A:
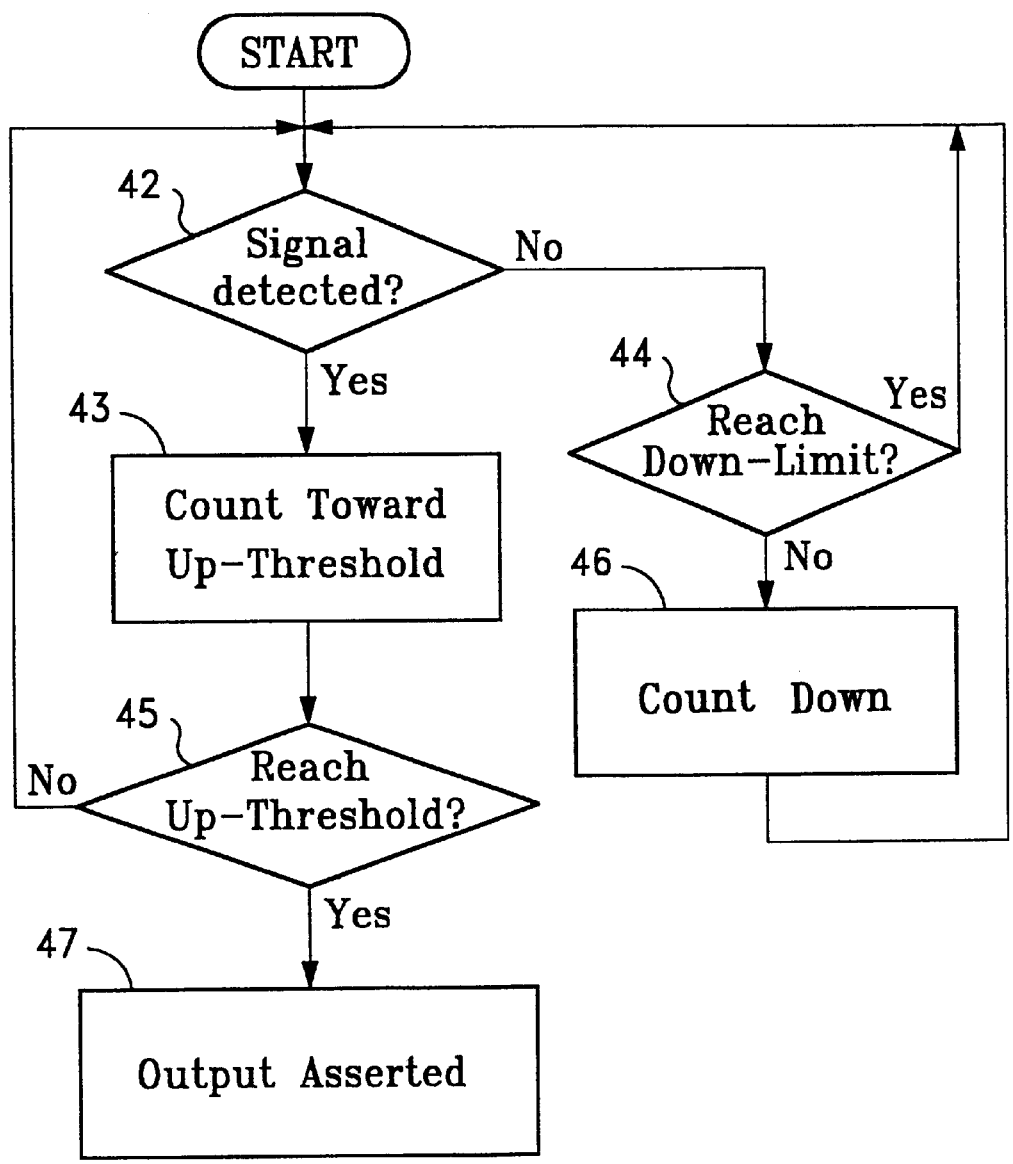
FIGS. 4A and 4B illustrate the flow charts related to the apparatus of FIG. 3.
Figure 4B:
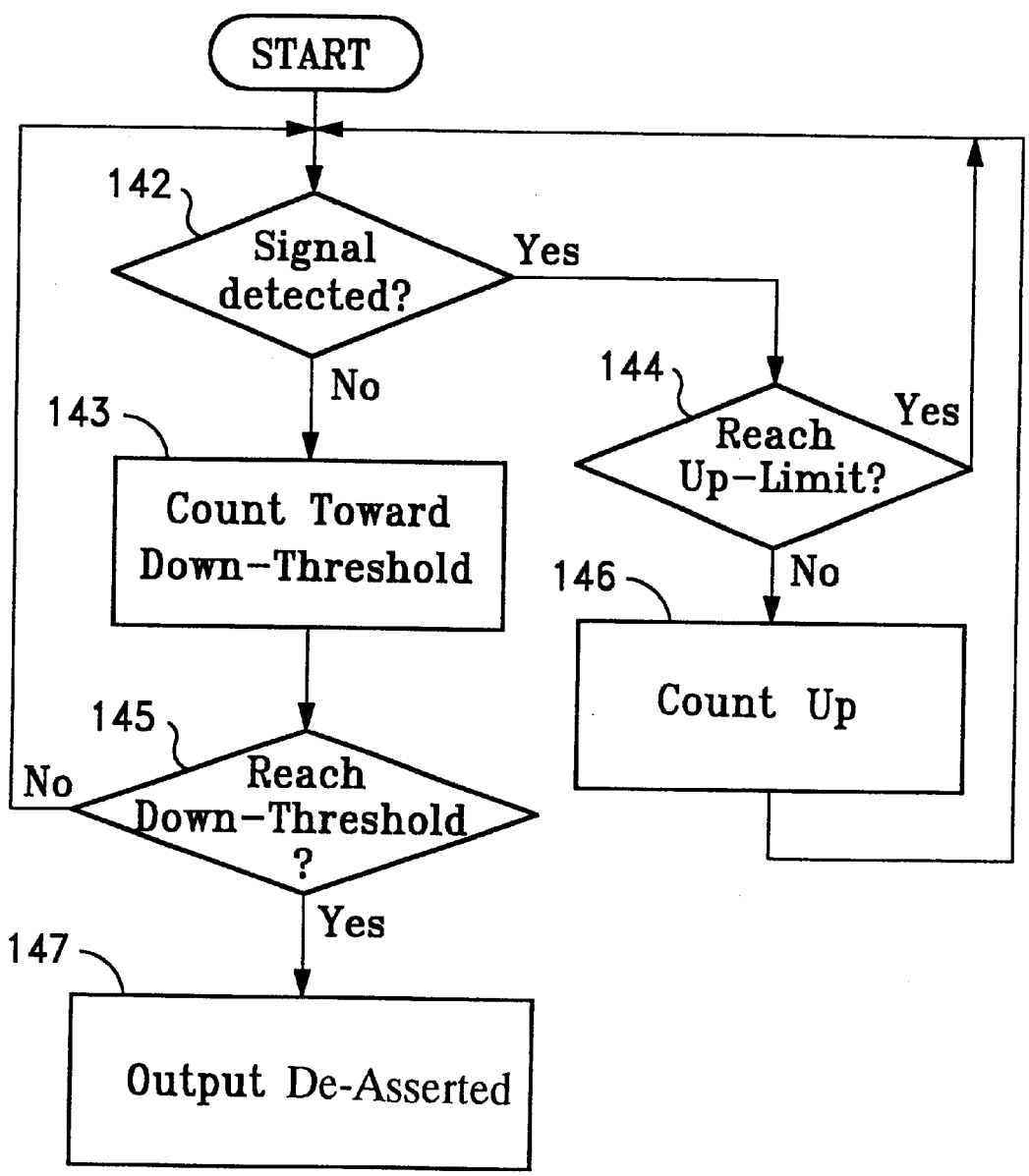

The foregoing description concerning the flow of FIG. 4A relates to the detection of the presence of the incoming signal IDET. According to the same principle, the detection of the absence of the incoming signal IDET can similarly illustrated in the flow of FIG. 4B, which is self-explanatory. Specifically, the branch directions are reversed, and the up-threshold, down-limit, and down-threshold are replaced by down-threshold, up-limit, and up-threshold, respectively.

Figure 5:
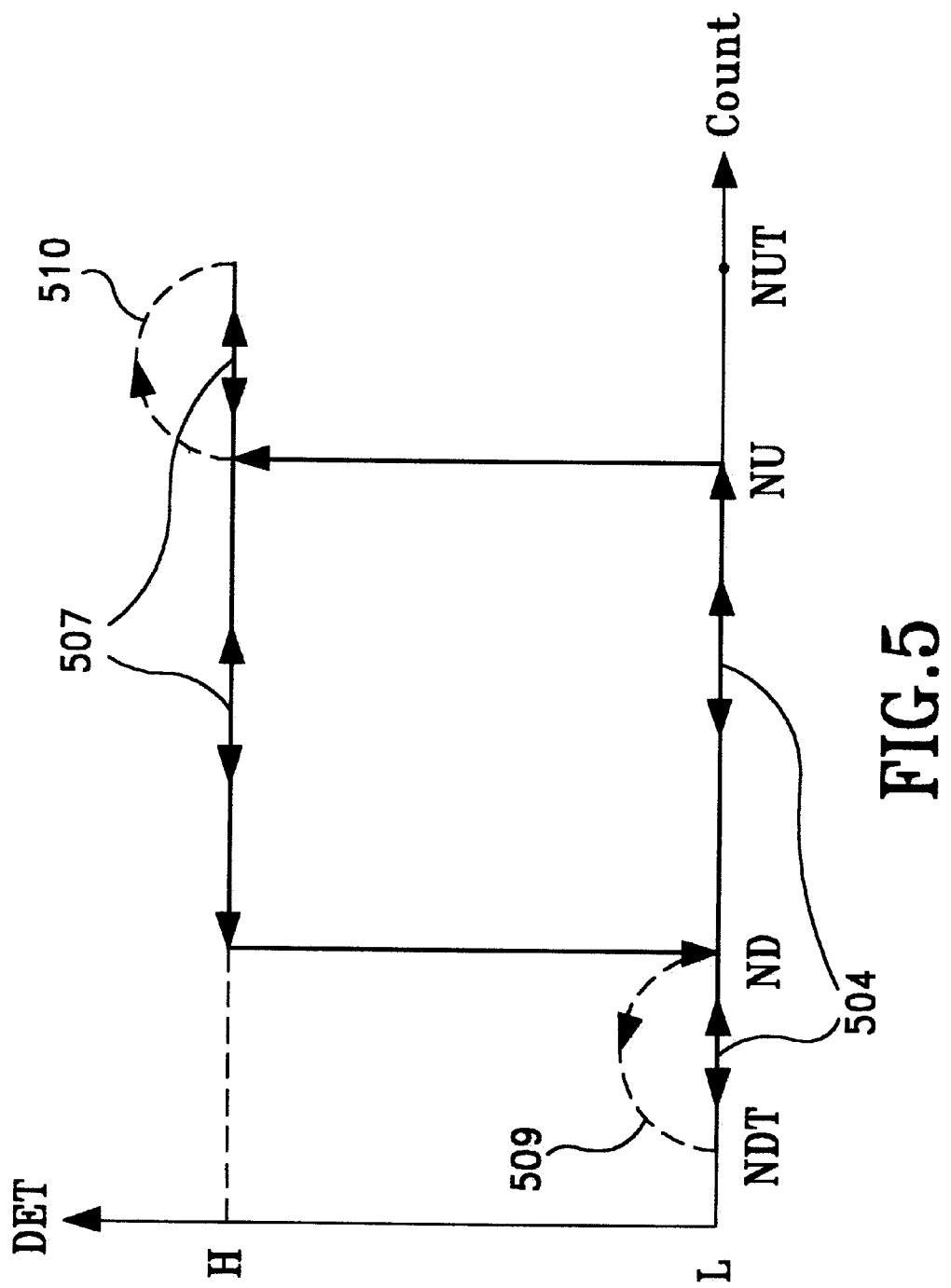
FIG. 5 shows an associated diagram of the count and the output signal DET according to one embodiment of the present invention.
Figure 6:
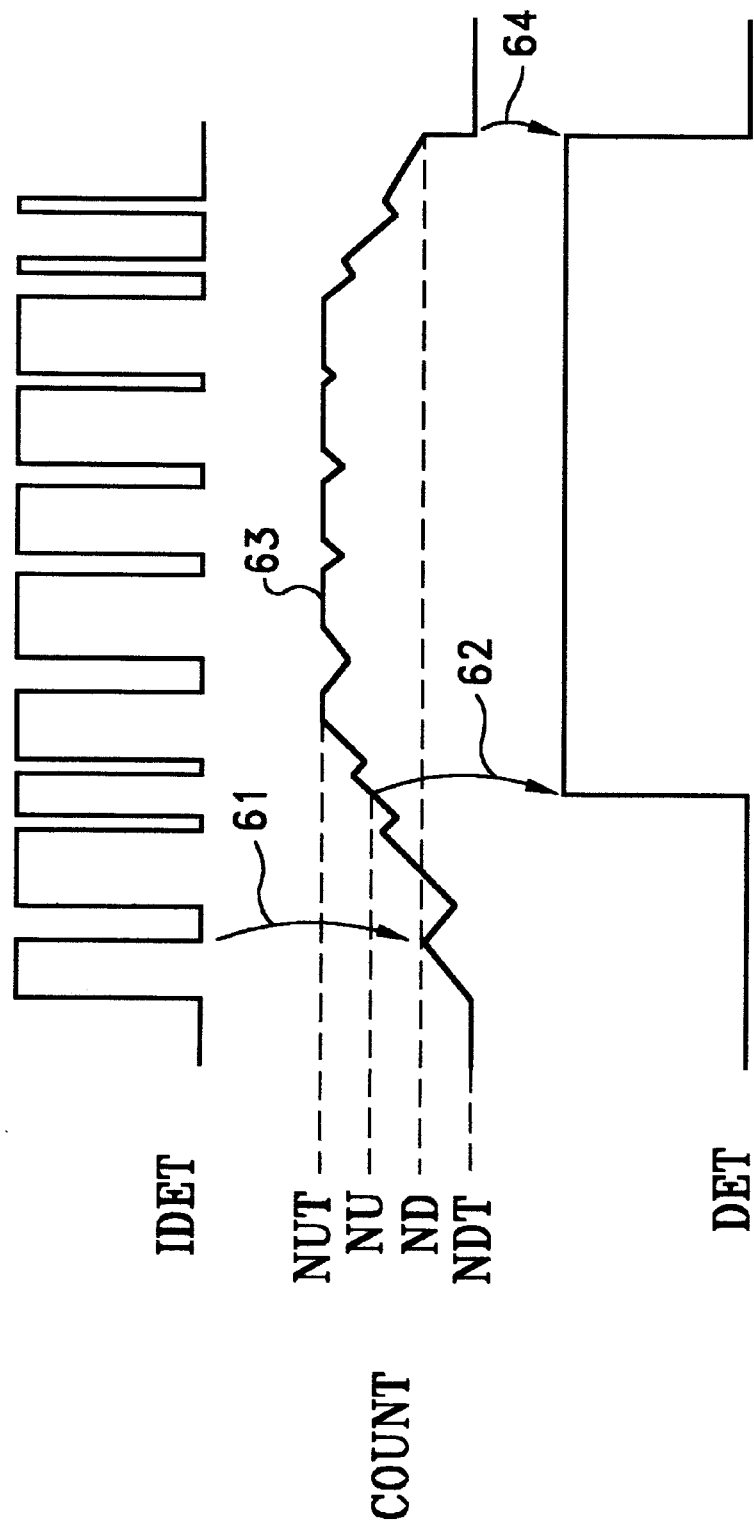
FIG. 6 shows a pertinent timing diagram related to FIG. 5.

For thoroughly understanding the operation of the apparatus and method of the present invention, a more specific example according to the embodiment of the present invention is demonstrated in FIG. 5, an associated diagram of the count and the output signal DET, and in FIG. 6, a pertinent timing diagram. In the FIG. 5, the vertical axis represents the voltage potential of the output signal DET, while the horizontal axis represents the count of the counter 30. At the beginning, the output signal DET remains at low level labeled L. In this embodiment, the counter 30 starts from an initial value NDT, which is also defined as the down-limit value in the embodiment. When the presence of the incoming signal IDET is detected, the count goes toward the up-threshold value NU; otherwise, the count goes toward the down-limit value NDT (for example, at the time labeled as 61) but never below that value NDT. The movement of the count before the assertion of the active output signal DET is shown as the arrows 504.

Still referring to FIGS. 5 and 6, when the count reaches the up-threshold value NU, the output signal DET is asserted active (high in this embodiment), for example, at the time labeled as 62. It is observed that, in this embodiment, the count is optionally set to the up-limit value NUT as shown in 510. The set described above can be achieved by a set/reset circuit 36 of the present apparatus (FIG. 3). Afterwards, the count goes toward the down-threshold value ND. More specifically, when the presence of the incoming signal IDET is not detected, the count goes toward the down-threshold value ND; otherwise, the count goes toward the up-limit value NUT but never above that value NUT (for example, at the time labeled as 63). The movement of the count before the de-assertion of the output signal DET is shown as the arrows 507.

The aforementioned operation continues until when the count reaches the down-threshold value ND, and the output signal DET is then de-asserted (becomes low in this embodiment), for example, at the time labeled as 64. It is observed that, in this embodiment, the count is optionally reset to the down-limit value NDT as shown in 509 (FIG. 5). The reset described above can be achieved by a set/reset circuit 36 of the present apparatus (FIG. 3).

Figure 7:
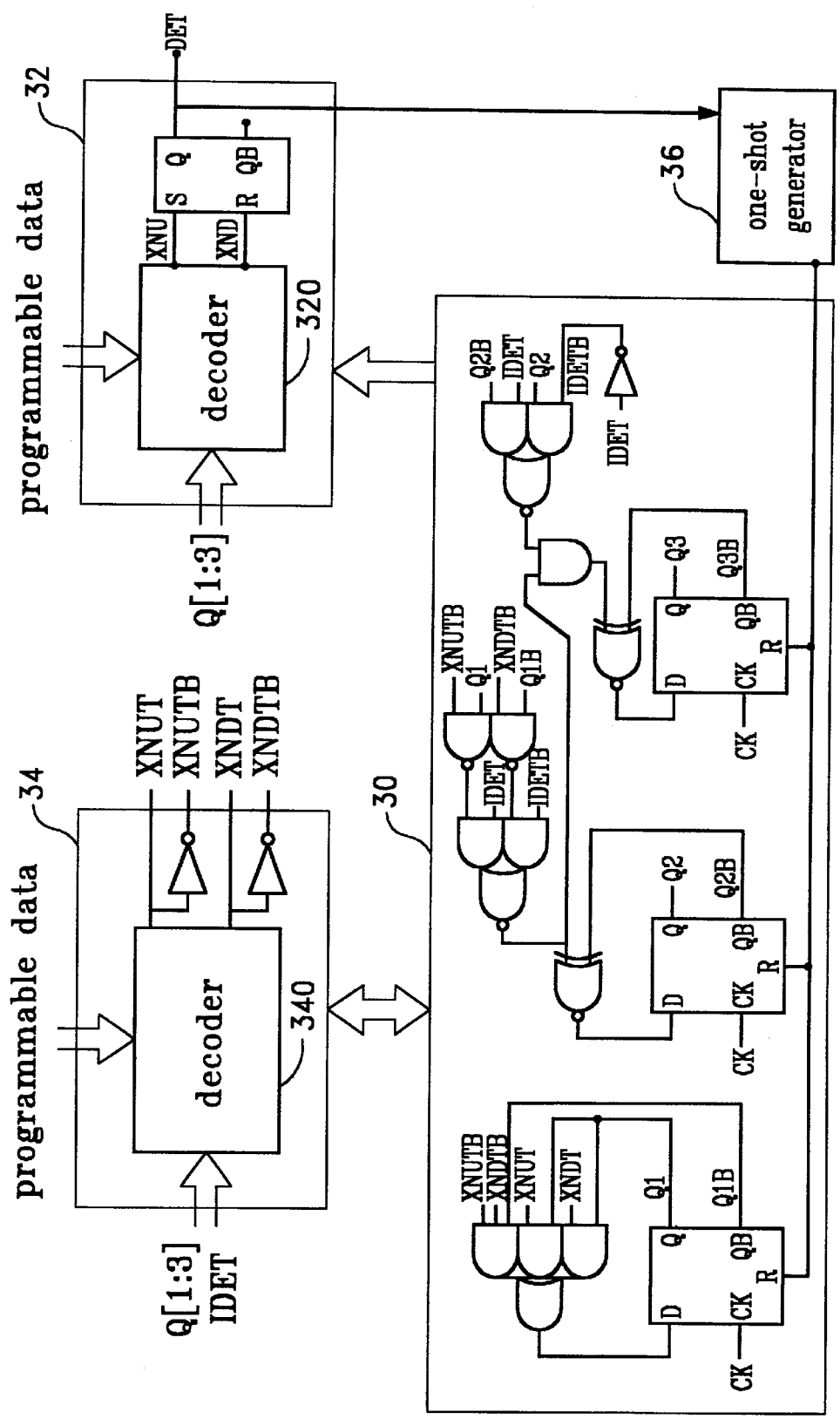
FIG. 7 shows a schematic diagram of an apparatus for recovering an information signal corrupted by noise according to the present invention.

FIG. 7 shows a schematic diagram of an apparatus for recovering an information signal corrupted by noise, wherein the same numerals are used as in the corresponding diagram of FIG. 3. The counter 30 includes a conventionally three-stage up-down counter. It is appreciated that number of the stage is not limited to that in the present specific embodiment. At the beginning, the level of the output signal DET of the determining circuit 32 remains at low (i.e., DET=0) before the presence of the incoming signal IDET is detected. The counter 30 counts from Q[1:3]='000', which is also used as the down-limit value. When the active signal IDET is present (i.e., IDET=1), the counter 30 continuously counts up toward the up-threshold value; otherwise, the counter 30 counts down toward the down-limit value. The limit controller 34 decides whether the count of the counter 30 reaches the down-limit value by using, for example, a decoder 340, thereby preventing the counter 30 from further counting down below the down-limit value. The determining circuit 32 continuously checks the count Q[1:3] by, for example, a decoder 320 to determine whether the count reaches the up-threshold value. The determining circuit 32 outputs an active signal DET=1 when the count reaches the predetermined up-threshold value. It is noted that the up-threshold value is generally equal to or less than the up-limit value.

Afterwards, the count goes down whenever the absence of the signal IDET (i.e., IDET=0) exists. The output signal DET remains high (i.e., DET=1) until the counter 30 counts down to the predetermined down-threshold value. Further, the limit controller 34 continuously checks the count of the counter 30 so that the counter 30 never counts below the predetermined down-limit value. It is noted that the down-threshold value is generally equal to or greater than the down-limit value.

Moreover, a set/reset circuit 36, such as a conventional one-shot generator, is used to reset the count Q[1:3] when the output signal DET changes state from active to inactive (i.e., DET=1–>0 in this embodiment). The up-threshold value determined by the determining circuit 32 and the down-limit value checked by the limit controller 34 can, respectively, be a fixed data stored therein, or be a variable that is dynamically written thereunto for effectively eliminating the noise, or accommodating various specifications of devices and environment.

Figure 8:
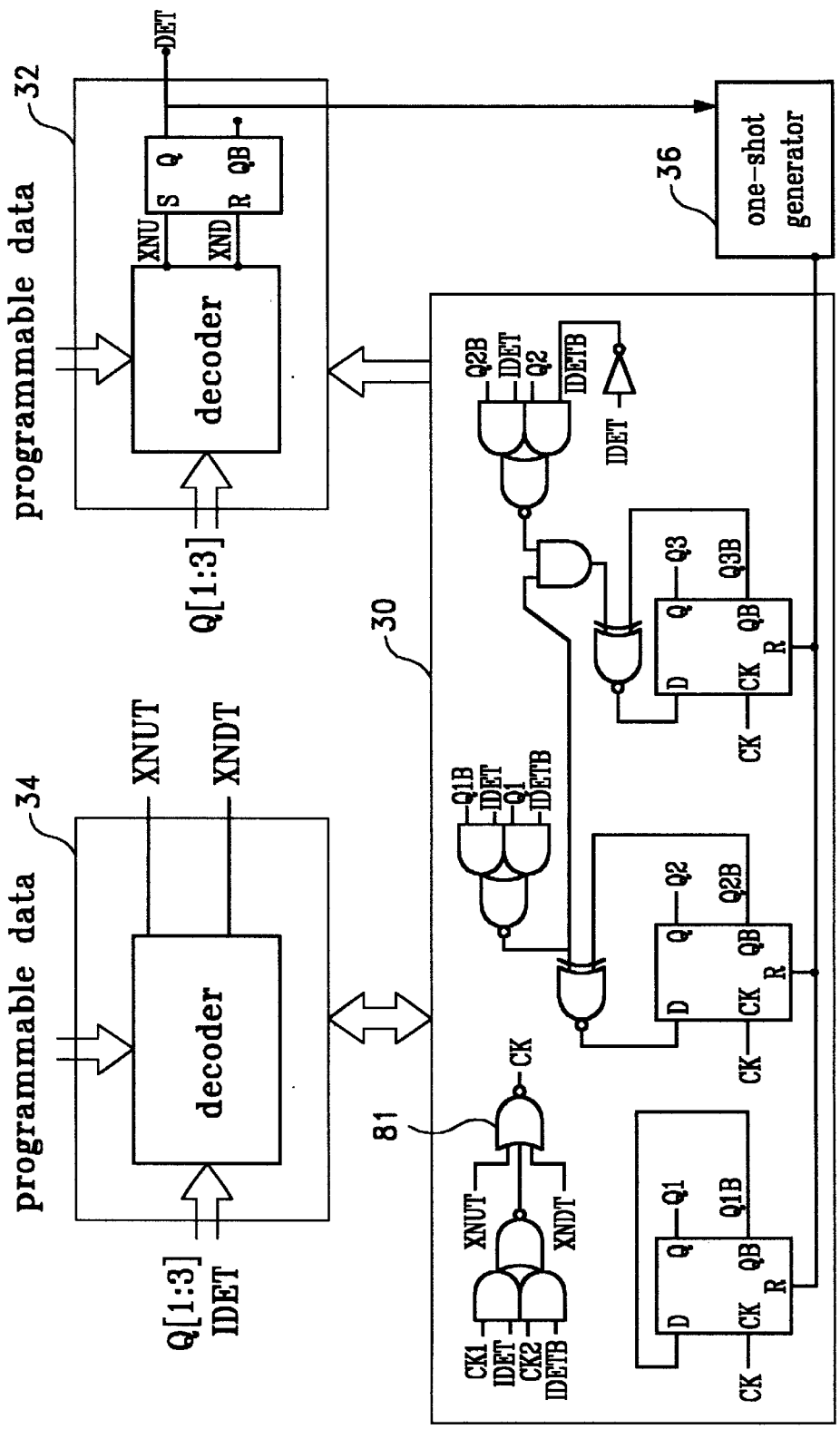
FIG. 8 shows a schematic diagram of another apparatus for recovering an information signal corrupted by noise according to the present invention.

FIG. 8 shows a schematic diagram of another apparatus for recovering an information signal corrupted by noise. The circuit of FIG. 8 is structurally similar to that of FIG. 7, and therefore, only major difference therebetween is described below. First of all, the system clock CK in FIG. 7 is directly fed to the corresponding clock terminal of each stage of the counter 30; while the clock signal CK in FIG. 8 is derived from the system clocks CK1 and CK2, which are gated by a NOR gate 81 corresponding to the present state (i.e., up or down) decided by the limit controller 34. Secondly, the system clock CK1 and CK2 are used for counting up and down, respectively. Particularly, the frequency of the system clock CK1 and CK2 can be made different for optimally accommodating a particular situation. For example, in a telephone conversation, a sound signal may probably be mistaken as a call-waiting signal requiring an interrupting connection to a called party. By adjusting the frequency of the system clock CK1, for example, larger than that of the system clock CK2, the false triggered output signal DET can be easily distinguished from a normal active output signal DET due to its narrower active width than the normal one.

Accordingly, the present invention provides an apparatus and method for effectively eliminating noise, and more particularly, for cumulatively eliminating the superimposition of extra-signal fluctuations that corrupts an information signal. The present invention overcomes the disadvantages of the prior apparatus or method that usually misses detecting the input signal or generates false triggering in detecting a severely corrupted signal.

Although specific embodiments have been illustrated and described, it will be obvious to those skilled in the art that various modifications may be made without departing from what is intended to be limited solely by the appended claims.

What is claimed is:

1. An apparatus for eliminating noise, said apparatus comprising:
   means for counting in at least two different directions in response to an input signal, said counting means being counting in a first direction when said input signal is active, and being counting in a second direction when said input signal is not active;
   means for determining whether a count value of said counting means reaches a predetermined first threshold value, said determining means asserting an output signal when the count value reaches the first threshold value, wherein said output signal remains asserted until a predetermined second threshold value is reached; and
   means for limiting the count value of said counting means, so that said counting means does not count beyond a predetermined first limit, and said counting means does not count below a predetermined second limit value.

2. The apparatus according to claim 1, further comprising means for resetting said counting means, wherein the count value of said counting means is reset to the second limit value when the second threshold value is reached.

3. The apparatus according to claim 1, further comprising means for setting the count value to the first limit value when the output signal is asserted.

4. The apparatus according to claim 1, wherein said second threshold value is equal to or greater than said second limit value.

5. The apparatus according to claim 1, further comprising at least one programmable data terminal for providing said predetermined first limit value and the second limit value to said limiting means.

6. The apparatus according to claim 1, further comprising at least one programmable data terminal for providing said predetermined first threshold value and the second threshold value to said determining means.

7. The apparatus according to claim 1, further comprising at least one clock terminal for providing at least one system clock signal for said counting means.

8. An apparatus for recovering a signal corrupted by noise, said apparatus comprising:
   an up-down counter, which counts up when said signal is active, and counts down when said signal is not active;
   a determining circuit, which asserts an output signal when said counter reaches a predetermined up-threshold value, said output signal remains asserted until said counter reaches a predetermined down-threshold value, wherein said up-threshold value is greater than said down-threshold value; and
   a limit controller, which prevents said counter from counting beyond a predetermined first limit value and from counting below a predetermined second limit value, said second limit value being equal to or less than said down-threshold value.

9. The apparatus according to claim 8, further comprising a resetting circuit in response to the output signal, said counter being reset to the second limit value when the counter counts down reaching the down-threshold value.

10. The apparatus according to claim 8, further comprising a setting circuit for setting the counter to the first limit value when the output signal is asserted, wherein said first limit value is equal to or greater than said up-threshold value.

11. The apparatus according to claim 9, wherein said resetting circuit comprises a one-shot generator.

12. The apparatus according to claim 10, wherein said setting circuit comprises a one-shot generator.

13. The apparatus according to claim 8, further comprising at least one programmable data terminal for providing said predetermined first limit value and the second limit value to said limit controller.

14. The apparatus according to claim 8, further comprising at least one programmable data terminal for providing said predetermined up-threshold value and the down-threshold value to said determining circuit.

15. The apparatus according to claim 8, further comprising at least one clock terminal for providing at least one system clock signal for said counter.

16. The apparatus according to claim 15, wherein said at least one system clock signal comprises a first clock and a second clock, wherein frequency of said first clock is different from frequency of said second clock.

17. The apparatus according to claim 8, wherein said determining circuit comprises a decoder, which decodes a count value of said counter to determine whether the count reaches the up-threshold value or the down-threshold value.

18. The apparatus according to claim 8, wherein said limit controller comprises a decoder, which decodes a count value of said counter to determine whether the count reaches the limit value.

19. A method for cumulatively eliminating noise, said method comprising:
   counting in a first direction when an input signal is active;
   counting in a second direction when the input signal is not active, wherein said second direction is different from said first direction, and wherein said counting in the second direction does not count beyond a predetermined limit value; and
   asserting an output signal when said counting in the first direction reaches a predetermined first threshold value, said output signal remaining asserted until a predetermined second threshold value is reached.

20. The method according to claim 19, further comprising a step of resetting counting in the second direction when the second threshold value is reached.

21. The method according to claim 19, further comprising a step of setting the counting in the first direction when the output signal is asserted.

* * * * *